United States Patent
Kaya

[11] Patent Number: 5,956,271
[45] Date of Patent: Sep. 21, 1999

[54] CHANNEL HOT ELECTRON PROGRAMMED MEMORY DEVICE HAVING IMPROVED RELIABILITY AND OPERABILITY

[75] Inventor: Cetin Kaya, Dallas, Tex.

[73] Assignee: Texas Instruments Incorporated, Dallas, Tex.

[21] Appl. No.: 08/989,959

[22] Filed: Dec. 12, 1997

[51] Int. Cl.⁶ .................................................. G11C 16/04
[52] U.S. Cl. ............................... 365/185.18; 365/185.27
[58] Field of Search ........................ 365/185.14, 185.18, 365/185.01, 185.27; 257/371

[56] References Cited

U.S. PATENT DOCUMENTS

| | | | |
|---|---|---|---|
| 5,457,652 | 10/1995 | Brahmbhatt | 365/185.18 X |
| 5,491,657 | 2/1996 | Haddad et al. | 365/185.18 X |
| 5,657,271 | 8/1997 | Mori | 365/185.18 X |
| 5,751,631 | 5/1998 | Liu et al. | 365/185.01 |

*Primary Examiner*—Huan Hoang
*Attorney, Agent, or Firm*—Bobby T. Holland; Richard L. Donaldson

[57] ABSTRACT

A CHE programmed memory device (30) avoids forward biasing at an isolated P-well (38) junction with a deep N-well (36) and prevents emitting electrons that may cause voltage buildup across the isolated P-well region (38) by applying a forward bias current (50) or voltage source (40) connected to the deep N-well region (36) for slightly forward biasing the deep N-well region. This maintains the voltage drop of isolated P-well region (38) below the diode turn-on voltage.

12 Claims, 2 Drawing Sheets

FIG. 1
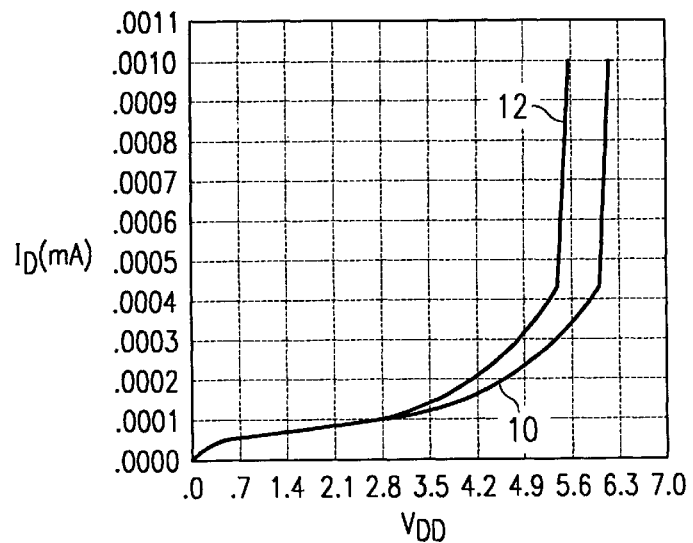
FIG. 2
| Vb | Vt INITIAL | Vt AFTER STRESS | DELAT Vt |
|---|---|---|---|
| 0.0 | 6.50 | 6.40 | 0.10 |
| 0.6 | 6.50 | 6.45 | 0.05 |
| 0.7 | 6.50 | 6.00 | 0.05 |
| 0.8 | 6.45 | 3.60 | 2.85 |
FIG. 3
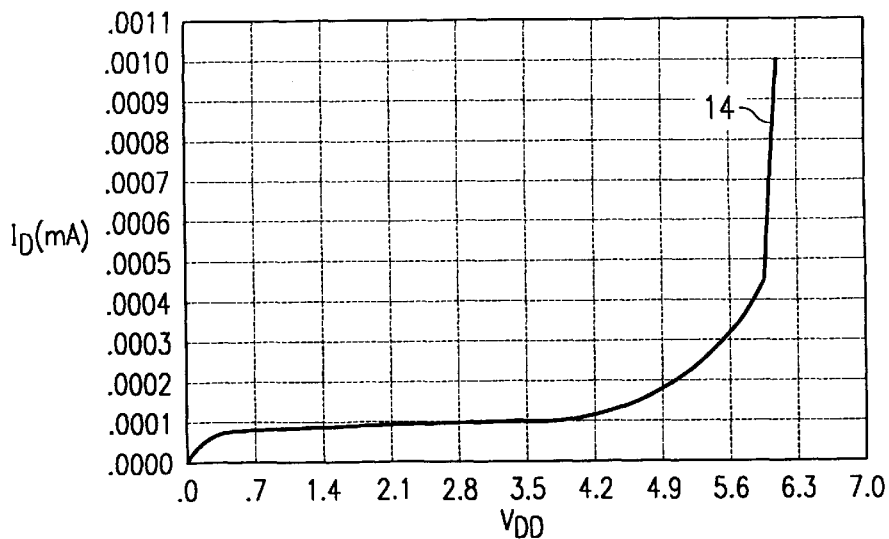

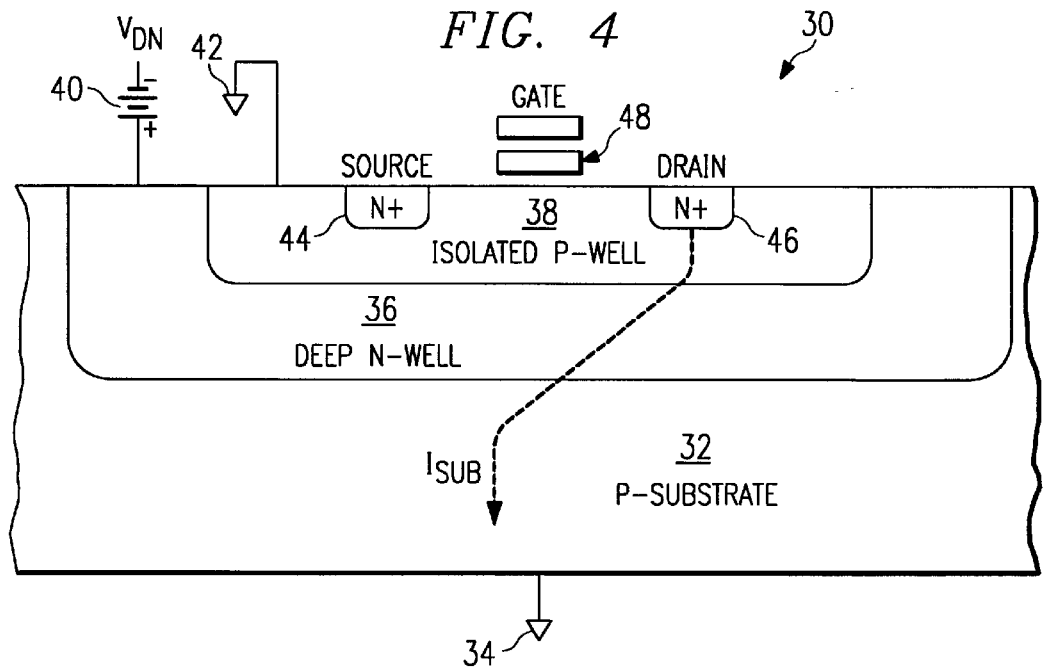
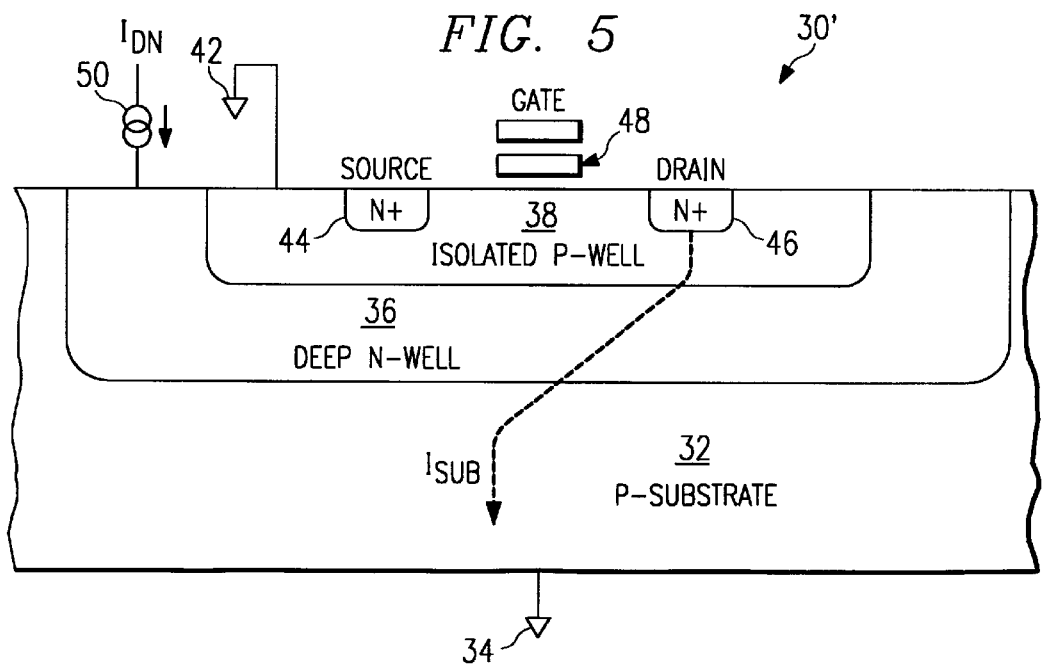

CHANNEL HOT ELECTRON PROGRAMMED MEMORY DEVICE HAVING IMPROVED RELIABILITY AND OPERABILITY

This is a Non Provisional application filed under 35 USC 119(e) and claims priority of prior provisional, Ser. No. 60/032,847 of inventor Cetin Kaya, filed Dec. 13, 1996.

TECHNICAL FIELD OF THE INVENTION

The present invention relates to semiconductor devices and, more particularly, to a memory devices such as EPROMs and Flash EPROMs and, even more particularly, to a channel hot electron (CHE) programmed memory device having improved reliability and operability.

BACKGROUND OF THE INVENTION

CHE programming of electrically erasable programmable read-only memories (EPROMs) and flash EPROMs can generate between 50 $\mu$A–100 $\mu$A of cell current. For state of the art devices, which are often built onto P-type epitaxial layers over a low resistivity substrate, this substrate current sinks into the low resistivity layer and does not generate significant voltage drop. However, for EPROMs and flash EPROMs that use a non-epitaxial layer substrate, or ones that are built on an isolated P-well surrounded by a deep N-well, such as in a triple well process, the substrate current that is generated during programming can build up large voltage drops across the resistive FAMOS P-well region.

If voltage drop exceeds the diode turn-on voltage of approximately 0.7 volts, then the source junction will forward bias. This problem of the resistive P-well situation may be seen in a lowering of the floating-gate avalanche-injection metal oxide semiconductor (FAMOS) BVCEO voltage value. Lowering the BVCEO values, unfortunately, reduces the maximum drain potential of the device. For a constant current programming load line, this reduces the gate current and degrades programmability of the EPROM or flash EPROM.

FIGS. 1 and 2 show the adverse effects of lower and BVCEO voltage values. In particular, FIG. 1 illustrates a plot of two BVCEO characteristic lines for a flash EPROM cell built over a triple well structure that includes an isolated P-well within a deep N-well. In the first case of line 10, the isolated P-well is well grounded and the deep N-well potential is at ground potential. The resistance R equals 15Ω. In the second case of line 12, the isolated P-well is simulated to be resistive at a value of 15 KΩ. Line 10 shows the shift in the BVCEO characteristic that yields a lowered programming voltage and generally degrades performance of the memory.

Another problem that arises when the substrate current builds up a voltage drop across the resistive FAMOS P-well is that once the source junction forward biases, it sprays electrons into the substrate. Some of the electrons will be collected by the drain junctions of the adjacent cells in the bit line stress mode. In this case, electrons entering the high electric field region near the drain create hot electron-holes pairs. Due to the polarity of the gate field near the drain, these hot electron-hole pairs are likely to be injected into the gate oxide and cause charge loss from the floating gate.

The table of FIG. 2 shows the effect of rising body potential on bit line stress. In the table of FIG. 2, the gate voltage, $V_g$, equals zero; the drain voltage, $V_d$, equals six volts; and the source voltage, $V_s$, equals zero. Bit line stress occurs for approximately one second, in this example. The parameter, $V_b$, represents the bins voltage across the resistive FAMOS P-well region. As the FIG. 2 table shows, with $V_b$ exceeding 0.7 volts, the threshold voltage, $V_t$ values of 0.10, 0.05, and 0.5 when $V_b$ was at or below 0.7 volts. The lowered $V_t$, therefore, indicates the degraded programmability that breakdown of the source junction diode causes. Basically, as the substrate potential rises, the charge loss from floating gate rises correspondingly. This phenomenon exhibits an approximately exponential cause and effect relationship. Also, there is some expectation that the above-stated bit line stress mechanism causes grain degradation in flash memory devices as a result of the hot hole injection.

To avoid the above issues, the voltage drop in the substrate during programming should stay below the diode turn on voltage of approximately 0.7 volts. One way to achieve this result is to reduce the FAMOS P-well sheet resistance. Unfortunately, for triple well technology, this solution increases the process complexity. Therefore, there is a desire to build single isolated P-well to meet the CMOS requirements for negative voltage switching, and use the same isolated well for FAMOS devices. In this case, the high sheet resistance of the isolated P-well cannot meet the FAMOS requirements. For large arrays, the substrate bias build-up during programming forward biases the source junction and cause the above-stated device reliability concerns.

Other known solutions to this problem are process-oriented, using either a low-sheet-resistance FAMOS P-well or a very high energy implant. Both solutions, however, increase the process and the device-design complexities.

SUMMARY OF THE INVENTION

In light of the above limitations, there is a need for a CHE programmed memory device having improved reliability and operability that substantially eliminates or reduces problems of forward biasing the isolated P-well junction and emitting electrons into the P-substrate problems, without the undesirable process and device design complexities that affect existing methods and devices.

According to one aspect of the present invention, there is provided a CHE programmed memory device having improved reliability and operability that avoids forward biasing at the isolated P-well junction and emitting electrons into the substrate by slightly forward biasing the deep N-well with respect to the isolated P-well.

In one embodiment of the present invention, the forward bias is applied as a voltage to the deep N-well in the range of –0.3 V–0.5 V, or a negative constant current of approximately –10 $\mu$A that is pumped into the deep N-well with isolated P-well being grounded. With the isolated P-well/deep N-well diode slightly forward biased, any substrate current generated during programming can easily forward bias this diode more. This results in pumping holes into the P-substrate. In that case, the isolated P-well potential does not rise more than 0.2 V–0.3 V. This essentially eliminates the problems of forward biasing the isolated P-well junction and spraying electrons into the P-substrate.

A technical advantage of the present invention is that is makes the use of resistive isolated P-wells in triple well designs practical by diverting the substrate current into the low resistivity P-substrate during programming. The present invention simplifies the process of building a flash EPROM array over a triple well by eliminating the requirement for a separate low-sheet-resistance, FAMOS P-well, thereby reducing fabrication costs. The present invention does not require an additional well and requires only a small circuit change. Moreover, present the invention is useful for all EPROMs built on triple wells.

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein:

FIG. 1 shows a plot of BVCEO as a function of drain current that occurs in a flash EPROM that uses a non-epitaxial layer over a deep N-well, such as in a triple well process;

FIG. 2 provides a table summarizing the disadvantageous efforts of the rising body potential on bit line stress;

FIG. 3 provides a plot of BVCEO as a function drain current that occurs in a flash EPROM such as that to which FIGS. 1 and 2 relate, but which employs the teachings of the present invention;

FIG. 4 depicts one embodiment of the present invention; and

FIG. 5 shows an alternative embodiment of the present invention.

DETAILED DESCRIPTION OF THE INVENTION

Preferred embodiments of the present invention are illustrated in the FIGURES like numerals being used to refer to like and corresponding parts of the various drawings.

FIG. 3 illustrates a BVCEO line 14 showing the results of applying the concepts for which $R_B$=15 Ohms and the deep N-well current is constant at –5 μA, to yield a deep N-well potential of approximately –0.4 V. By pumping a slightly negative voltage into the deep N-well no shift in the BVCEO characteristic curve occurs, as was the case in the BVCEO plots of FIG. 1. Accordingly, no reduction in $V_t$ after bitline stress occurs. The result is that no degradation in programmability or gate current reduction occurs with the present invention.

FIG. 4 shows one embodiment of the present invention that includes memory cell 30 formed on P-substrate 32 which itself is grounded at ground connection 34. Forming the components of memory cell 30 may use any of a variety of known fabrication processes. Deep N-well 36 surrounds isolated P-well 38. Instead of grounding deep N-well 36, a slightly negative voltage $V_{DN}$ of approximately –0.4 V is applied to deep N-well 36 at connection 40. Isolated P-well 38 is grounded at ground potential connection 42. Within isolated P-well 38, N⁺ region 44 is for forming the memory cell source region and N⁺ region 46 is for forming the associated drain region. Gate dielectric region 48 is positioned over isolated P-well 38 between source N⁺ region 44 and drain N⁺ region 46.

FIG. 5 illustrates an alternative embodiment of the present invention with reference numerals generally referring to the elements of FIG. 4. FIG. 5, however, shows deep N-well current source 50, instead of deep N-well voltage source 40, connecting to deep N-well 36. Current source 50 pumps a negative current of approximately –10 μA into deep N-well 36. Isolated P-well 38 is grounded, as before. With the junction between deep N-well 36 and isolated P-well 38 slightly forward biased, any current, $I_{SUB}$, within P-substrate 32. The result is that the potential of isolated P-well 38 will not exceed 0.2–0.3 volts. This essentially eliminates the reduced gate current and programmability problems of the prior art devices.

Although the invention has been described in detail herein with reference to the illustrative embodiments, it is to be understood that this description is by way of example only and is not to be construed in a limiting sense. It is to be further understood, therefore, that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. A CHE programmed memory device having improved reliability and operability, comprising:
    a P-substrate;
    an N-well region within said P-substrate;
    an isolated P-well region within said N-well region;
    a source region within said isolated P-well region;
    a drain region within said isolated P-well region;
    a gate region between said source region and said drain region; and
    a forward bias circuit connected to said N-well region for forward biasing said N-well region with respect to said isolated P-well for maintaining the voltage drop of said isolated P-well region below the diode turn-on voltage of the junction between said isolated P-well region and said N-well region.

2. A CHE programmed memory device having improved reliability and operability, comprsing:
    a P-substrate;
    an N-well region within said P-substrate;
    an isolated P-well region within said N-well region;
    a source region within said isolated P-well region;
    a drain region within said isolated P-well region;
    a gate region between said source region and said drain region; and
    a forward bias circuit connected to said N-well region for forward biasing said N-well region with respect to said isolated P-well for maintaining the voltage drop of said isolated P-well region below the diode turn-on voltage of the junction between said isolated P-well region and said N-well region;
    said forward bias circuit comprising a current bias circuit for pumping a bias current into said N-well.

3. The device of claim 1, wherein said forward bias circuit comprises a voltage bias circuit for supplying a bias current to said deep N-well.

4. The device of claim 1, wherein said memory device comprises an electrically erasable, programmable read-only memory.

5. The device of claim 1, wherein said memory device comprises a flash electrically erasable, programmable read-only memory.

6. The device of claim 1, wherein said forward bias circuit comprises a voltage bias circuit for applying a voltage sufficient to limit the isolated P-well potential to not greater than approximately 0.3 volts.

7. The device of claim 1, wherein said forward bias circuit comprises a current source bias circuit for applying a current sufficient to limit the isolated P-well potential to not greater than approximately 0.3 volts.

8. A method for improving the operation of a CHE programmed memory device comprising the steps of:
    providing a P-substrate, an N-well region within the P-substrate, an isolated P-well region within said N-well region, a source region within said isolated P-well region, a drain region within said isolated P-well region, and a gate region between said source region and said drain region and
    forward biasing the N-well region with respect to the isolated P-well for maintaining the voltage drop of said isolated P-well region below the diode turn-on voltage.

9. A method for improving the operation of a CHE programmed memory device comprising the steps of:

providing a P-substrate, an N-well region within the P-substrate, an isolated P-well region within said N-well region, a source region within said isolated P-well region, a drain region within said isolated P-well region, and a gate region between said source region and said drain region N-well region with respect to the isolated P-well for maintaining the voltage drop of said isolated P-well region below the diode turn-on voltage;

said forward biasing step further comprising the step of dumping a bias current into said N-well.

10. The method of claim 8, wherein said forward biasing step further comprises the step of supplying a bias current to said deep N-well.

11. The device of claim 8, wherein said forward biasing step further comprises the step of applying a voltage sufficient to limit the isolated P-well potential to not greater than approximately 0.2 volts.

12. The device of claim 8, wherein said forward biasing step further comprises the step of applying a current sufficient to limit the isolated P-well potential to not greater than approximately 0.2 volts.

* * * * *